(12) United States Patent
Brady et al.

(10) Patent No.: US 7,598,750 B2
(45) Date of Patent: Oct. 6, 2009

(54) FLUID FITTING ELECTROMAGNETIC EFFECTS TEST CHAMBER

(75) Inventors: Vaughn Lawrence Brady, Normandy Park, WA (US); Gregory Mark Waugh, Renton, WA (US); Michael Eugene Lomax, Everett, WA (US)

(73) Assignee: The Boeing Company, Chicago, IL (US)

( * ) Notice: Subject to any disclaimer, the term of this patent is extended or adjusted under 35 U.S.C. 154(b) by 311 days.

(21) Appl. No.: 11/761,743

(22) Filed: Jun. 12, 2007

(65) Prior Publication Data

US 2008/0307906 A1   Dec. 18, 2008

(51) Int. Cl.
*H01H 31/02* (2006.01)
*G01R 31/02* (2006.01)
(52) U.S. Cl. ......................................... 324/555; 324/72
(58) Field of Classification Search ................. 324/555, 324/72
See application file for complete search history.

(56) References Cited

U.S. PATENT DOCUMENTS 5,982,331 A * 11/1999 Podgorski ................... 343/703
6,127,980 A * 10/2000 Podgorski ................... 343/703
6,903,357 B2 * 6/2005 Robb ......................... 250/554
2007/0000331 A1 * 1/2007 Cao et al. ..................... 73/707

* cited by examiner

*Primary Examiner*—Timothy J Dole
(74) *Attorney, Agent, or Firm*—Yee & Associates, P.C.; Dennis R. Plank

(57) ABSTRACT

An apparatus and method for testing electromagnetic effects. In one advantageous embodiment, the apparatus has a chamber, a door connected to the chamber, a gas supply system attached to the chamber, a plurality of electrical connectors attached to the chamber, a removable platform, and a specimen holding. The chamber has an opening into an interior space located in the chamber. The door closes to seal the opening and prevents a flammable gaseous mixture in the interior space from leaking out of the interior space of the chamber. The gas supply system is configured for connection to the gas supply system to allow introduction of the flammable gaseous mixture into the interior space. The removable platform is moveable into and out of the interior space of the chamber through the opening. The specimen holding system located on the removable platform and is configured to hold a specimen and is electrically connected to the plurality of electrical connectors when the removable platform is placed into the chamber, wherein an electrical current travels through the specimen when the electrical current is supplied by an electrical current source that is connected to the plurality of electrical connectors.

20 Claims, 13 Drawing Sheets

FLUID FITTING ELECTROMAGNETIC EFFECTS TEST CHAMBER

BACKGROUND INFORMATION

1. Field

The present invention relates to a method and apparatus for performing electromagnetic tests on components in an enclosed chamber.

2. Background

Aircraft are occasionally struck by lightning when traveling near or through a thunderstorm. Because, until recently, most aircraft structure was aluminum, these strikes did little or no damage. With more aircraft structure being fabricated from composite material, the electromagnetic effects of lightning strikes have taken on greater significance. In particular, an electrical strike may cause arcing between different components in the aircraft. This type of arcing is undesirable because an arc may cause flammable vapors or liquids in the aircraft to ignite.

In designing an aircraft, the different designers and engineers take into account electromagnetic effects, such as lightning. For example, cables and equipment are protected from damaging surges or transients through techniques such as shielding, grounding, and the application of surge protection or suppression devices. As another example, fuel systems and other systems that carry flammable liquids or vapors are an area of concern because even a tiny spark or arc may be disastrous. Extreme precautions are taken to assure that currents caused by lightning strike cannot cause sparks in any portion of an aircraft's fuel system. All of the structural joints and fasteners are designed to prevent sparks as lightning current passes from one section to another section of the aircraft. Other components such as access doors, fuel filler caps, and vents are designed to withstand lightning. All of the fuel lines that carry fuel into the engines are verified to be protected against lightning. Similar design concerns are made with respect to other systems that carry flammable fluids or vapors.

In verifying these designs, tests are performed on the various components to ensure that simulated lightning strikes do not cause arcing. These same concerns are also present in other environments in which high voltages or large electrical currents may occur.

Currently, testing is performed in a number of different ways. Electrical arcing may be determined to have occurred using photographic paper in a darkened chamber or by the ignition of a flammable mixture that has been introduced into an enclosed chamber. When using the ignition method, the particular component is placed into a chamber and the component is connected to an electrical source. A flammable gas mixture is introduced into the chamber and the electrical source is activated to simulate an electromagnetic event, such as a lightning strike. Should an ignition event be observed, it is assumed that arcing of sufficient energy to initiate the ignition has occurred.

Large chambers are currently used to test the many different possible components that go into an aircraft. Further, the existing testing systems require the test setup to be dismantled and reassembled between tests. These types of testing systems are time consuming and expensive because of the time and amount of gas required for each test. The individual setups for each test require a great deal of time and effort between each test and most test programs involve many separate tests. Added up these multiple tests require a great deal of time to setup, disassemble, and reassemble. In addition, the large chamber volume requires additional gas mixture and the time required to fill the chamber multiple times.

SUMMARY

The advantageous embodiments of the present invention provide an apparatus and method for testing electromagnetic effects. In one advantageous embodiment, the apparatus has a chamber, a door connected to the chamber, a gas supply system attached to the chamber, a plurality of electrical connectors attached to the chamber, a removable platform, and a specimen holding system. The chamber has an opening into an interior space located in the chamber. The door closes to seal the opening and prevents a flammable gaseous mixture in the interior space from leaking out of the interior space of the chamber. The gas supply system is configured for connection to the chamber to allow introduction of the flammable gaseous mixture into the interior space. The removable platform is moveable into and out of the interior space of the chamber through the opening. The specimen holding system located on the removable platform and is configured to hold a specimen and is electrically connected to the plurality of electrical connectors when the removable platform is placed into the chamber, wherein an electrical current travels through the specimen when the electrical current is supplied by an electrical current source that is connected to the plurality of electrical connectors.

In another advantageous embodiment, the apparatus has a chamber, an electrical interface in the chamber, a platform, a port, and a specimen mounting apparatus. The platform is moveable into and out of the chamber. The port allows introduction of a flammable gaseous mixture into the interior of the chamber. The specimen mounting apparatus is located on the platform to which the actual test specimen may be attached. Inserting the platform into the chamber provides an electrical connection between the electrical interface and a specimen mounted on the mounting apparatus. An electrical current applied to the electrical interface travels from the electrical interface to the mounting apparatus and through the specimen.

In yet another advantageous embodiment, a method is used to test specimens. The method includes connecting a current source to an electrical interface in the test chamber, connecting a gas supply to a port in the test chamber, and mounting a specimen on a platform. The platform with the specimen is placed into the test chamber. The test chamber is sealed after placing the platform into the test chamber. A flammable gaseous mixture is introduced into the interior of the test chamber after sealing the test chamber. An electrical current is supplied from the current source to the electrical interface to simulate an electromagnetic effect on the specimen.

The features, functions, and advantages can be achieved independently in various embodiments of the present invention or may be combined in yet other embodiments in which further details can be seen with reference to the following description and drawings.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an advantageous embodiment of the present invention when read in conjunction with the accompanying drawings, wherein:

DETAILED DESCRIPTION

Figure 1:
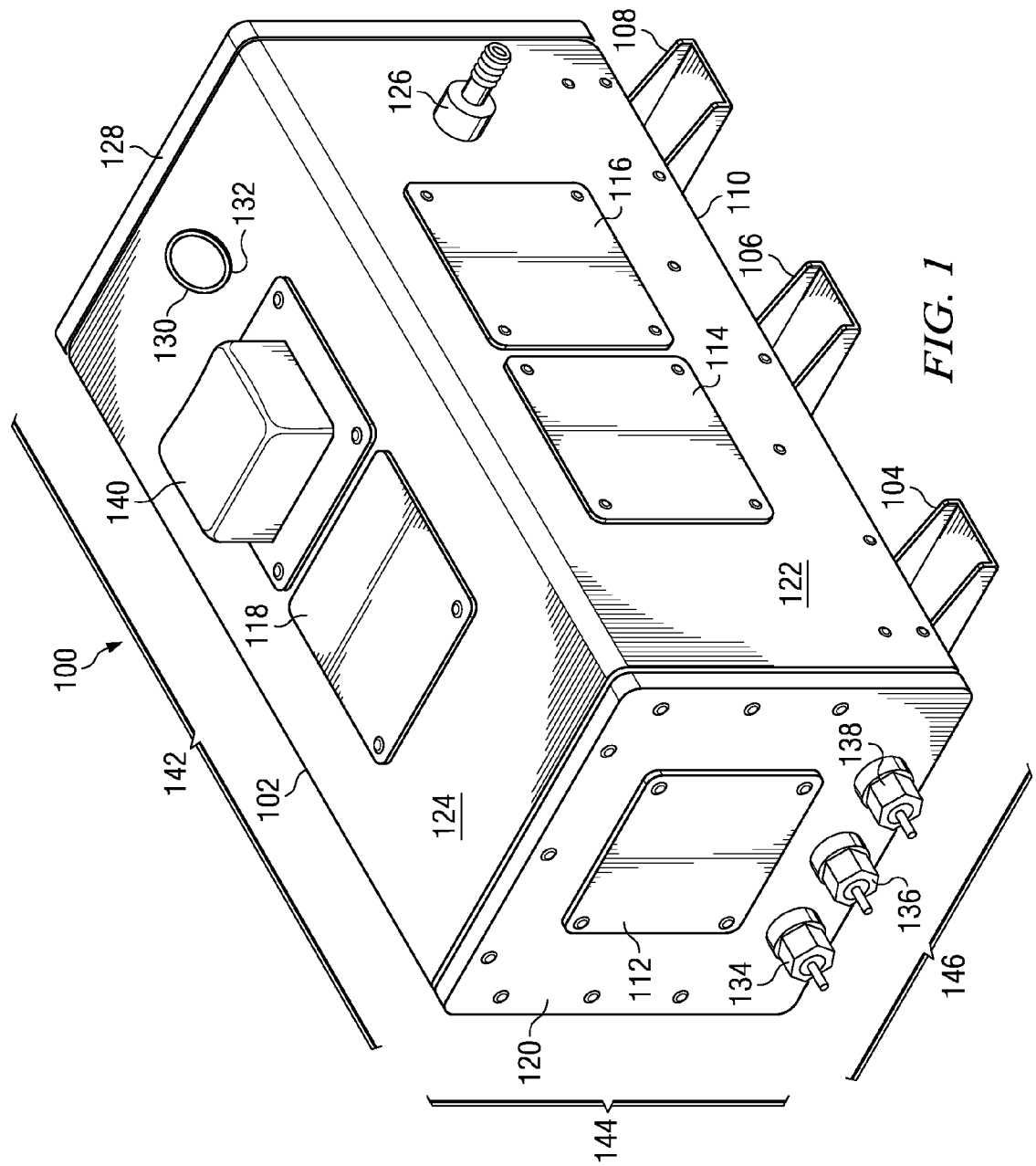
FIG. 1 is a diagram illustrating an isometric view of a fluid fitting electromagnetic test chamber in accordance with an advantageous embodiment of the present invention.

With reference now to the figures, and in particular with reference to FIG. 1, a diagram illustrating an isometric view of a fluid fitting electromagnetic test chamber is depicted in accordance with an advantageous embodiment of the present invention. In this particular example, test chamber 100 is an example of one implementation for an electromagnetic effects test chamber. Test chamber 100, in the different advantageous embodiments of the present invention, reduces the time required to perform testing of specimens.

Box 102 has footers 104, 106, and 108 on bottom side 110 of box 102. These footers are used to clamp or attach test chamber 100 to a structure, such as a table or a cart. Box 102 also contains windows 112, 114, 116, and 118. Window 112 is found on end 120 of box 102. Windows 114 and 116 are found on side 122 of box 102. Window 118 is found on top side 124 of box 102. The windows may be replaced with blanking plates or camera mounts should the need to use the "Light on Film" technique arise. Box 102 also contains port 126 on side 122. Port 126 provides a connection to introduce gas into the interior of box 102. Windows also are present on the side opposite side 122, which are not visible from this view. Door 128 provides a mechanism to place test components into the interior of box 102 of test chamber 100.

Further, door 128 is magnetically latched to prevent an over pressure condition. An over pressure condition is a condition in which the pressure in test chamber 100 may increase to a level such that damage to test chamber 100 may occur. For example, if the pressure increases too rapidly with the occurrence of an ignition event, a window could crack or shatter if door 128 was secured such that it could not open when pressure increased. An over pressure condition could occur if an improper gas mixture is used.

Reaction ball 130 and exhaust hole 132 provide an escape valve for gasses within the interior of box 102 during filling operations. Reaction ball 130 will pop up or move away from exhaust hole 132 to allow gasses to escape in the event that an ignition of gasses occurs within box 102. In these examples, sockets 134, 136, and 138 provide an electrical connection into the interior of box 102. These sockets provide a connection between an electrical source and the components within box 102 to simulate an electromagnetic event. Ignition unit 140 provides a spark of known energy to ignite gasses within the interior of box 102 verifying the gaseous mixture was flammable and was present inside test chamber 100 during the test.

Test chamber 100 provides an apparatus for testing components or parts such as fluid fittings for arcing or other electromagnetic effects in a flammable gas mixture. This chamber provides for electromagnetic effects testing with a flammable gas mixture, allows the introduction of electrical currents simulating lightning strikes, and provides a high degree of reliability to the testing. Further, test chamber 100 also provides an ability to increase the number of tests that may be performed within a period of time.

Test chamber 100 includes a platform or tray (not shown) that is to be placed into the test chamber. Specimens are to be mounted on this platform or tray. Multiple trays may be used to increase the speed at which components may be tested. After testing of one component in one tray, that tray may be removed from test chamber 100. A second tray may then be placed into test chamber 100. The second specimen on the second test tray may be tested while the specimen attached to the first tray is removed and a third specimen is attached to the first tray. The tray used within test chamber 100 is illustrated and described with respect to FIGS. 7-13 below.

Also, test chamber 100 has a size that requires a smaller volume of flammable gas mixtures for testing specimens in the illustrative examples. In particular, this smaller volume is especially useful for smaller specimens, such as connectors in the form of a joint, sleeve, or clamp that connects tubes, hoses, or other types of conduits to one another. This type of test chamber may also be used to test types of specimens other than the ones described in these examples.

For example, the different illustrative embodiments may be applied to test electrical components or other parts. As a result, less time is required to fill test chamber 100 as compared to other currently available test chambers. Further, the amount of flammable gas mixture required for each test also is reduced. Test chamber 100 also includes flexible nozzle 1312 designed to ensure proper flow of flammable gases into and around the test parts. This feature is accessed through port 126 in these examples.

Thus, the different advantageous embodiments of the present invention provide improved reliability and repeatability of testing as well as reducing the time required to perform each test. Further, the amount of gas needed for each test also is reduced. With the use of multiple trays, test setups may be accomplished outside of the test chamber. With the use of these trays, the specimens being tested can be quickly positioned in the chamber for each test.

This advantage is provided in one advantageous embodiment through the clamping system in the tray and the electrical connection provided between the test chamber and the tray that lead to the test specimens. For example, the test chamber, in these advantageous embodiments, is capable of running a test every 10 minutes, as compared to the 3 to 4 hours per test that can be run with existing chambers, designed to house larger components.

In these examples, test chamber 100 is fully wired to provide electrical test currents to test specimens when the tray is placed into test chamber 100. Further, the gaseous mixture provided to the test specimens is provided through port 126, which contains a flexible tube within test chamber 100. Port 126 is connected to a gas supply system.

Test chamber 100 also provides another advantage through fixed and isolated electrical connections to interface laboratory equipment. These connections do not have to be disconnected and then reconnected between each test specimen.

Figure 2:
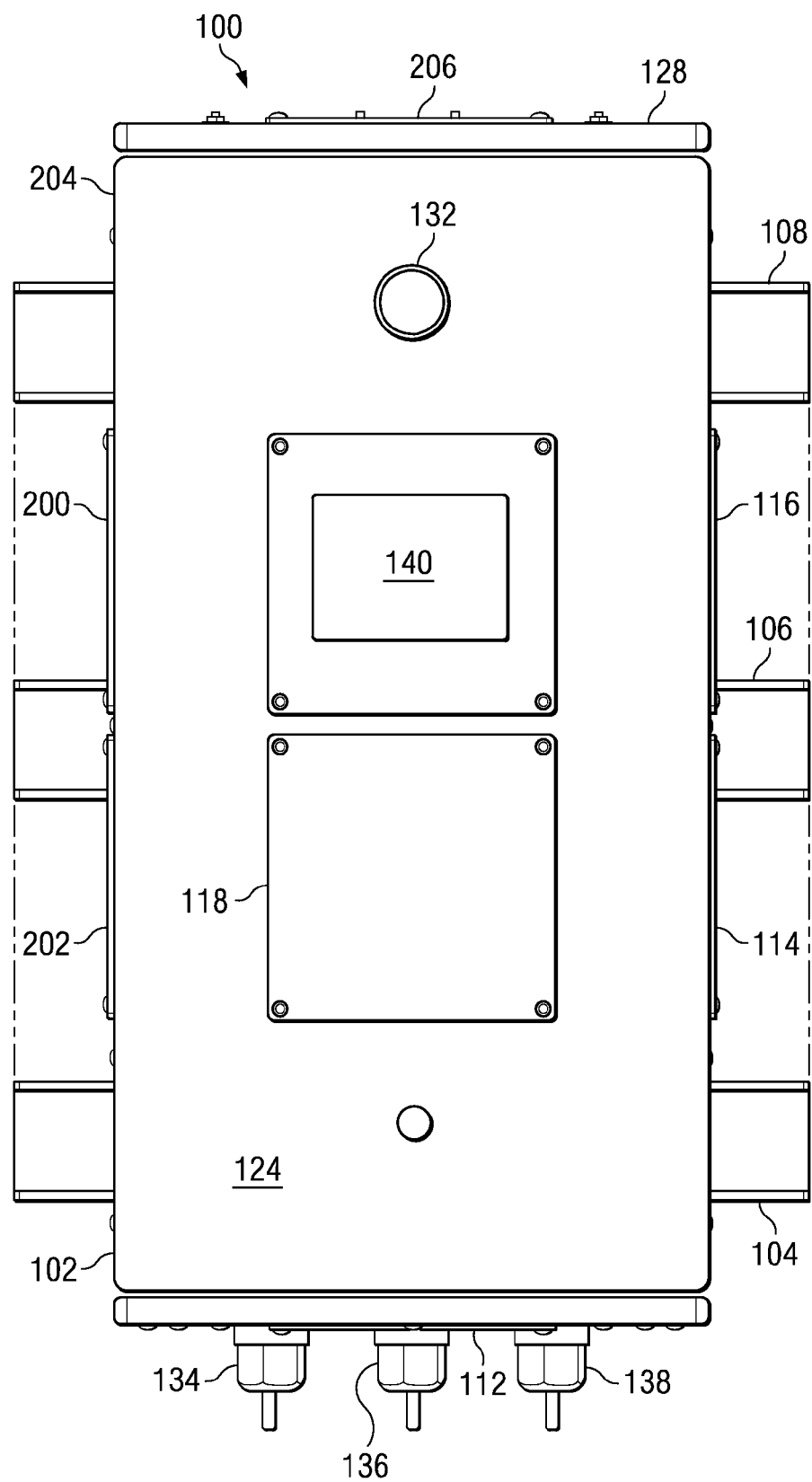
FIG. 2 is a diagram of a top plan view of a test chamber in accordance with an advantageous embodiment of the present invention.

Turning now to FIG. 2, a diagram of a top plan view of a test chamber is depicted in accordance with an advantageous embodiment of the present invention. In this example, windows 200 and 202 are located on side 204 on box 102 of test chamber 100. Additionally, in this view of box 102, window 206 can be seen on door 128.

Figure 3:
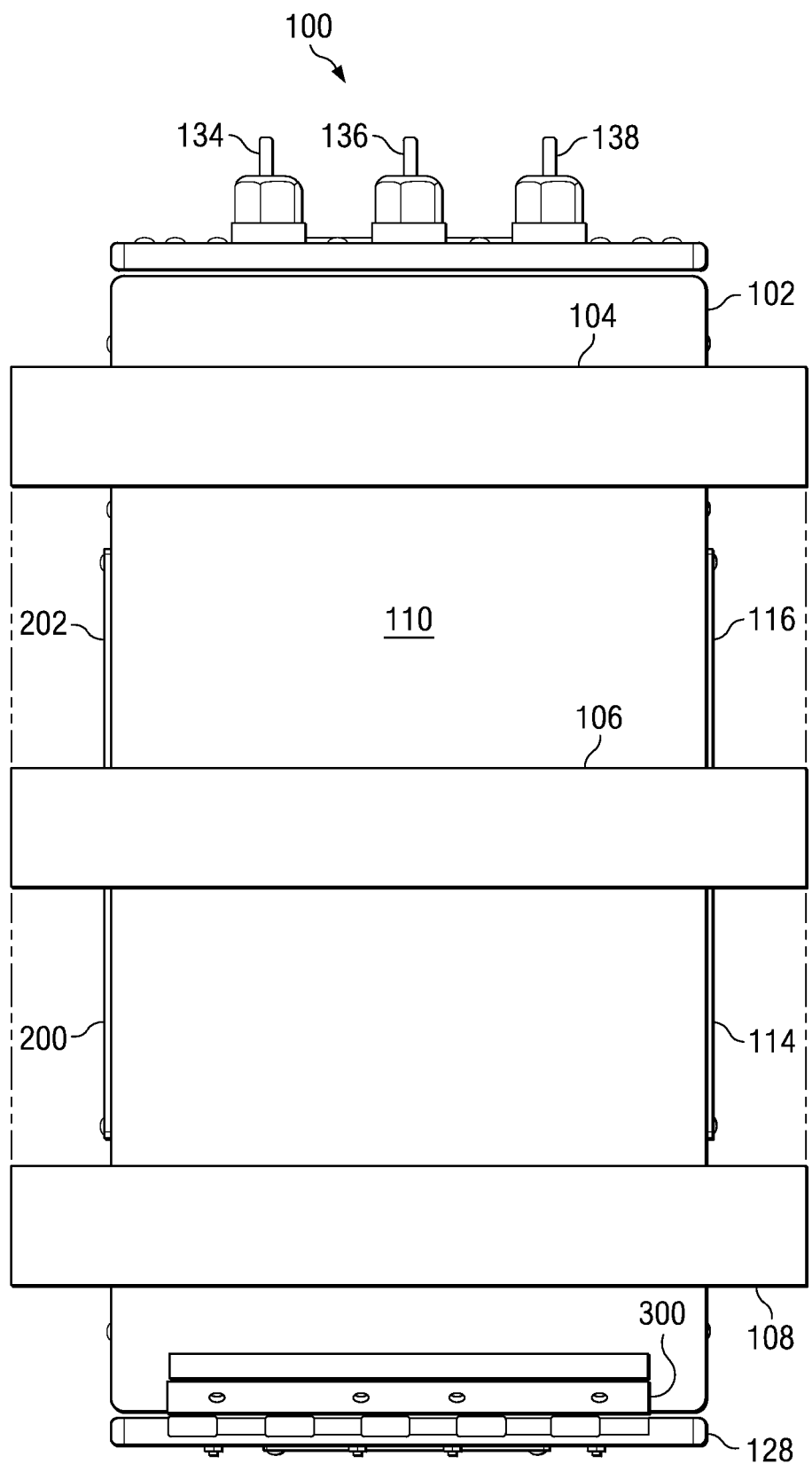
FIG. 3 is a bottom view of a test chamber in accordance with an advantageous embodiment of the present invention.

With reference next to FIG. 3, a bottom view of a test chamber is depicted in accordance with an advantageous embodiment of the present invention. In this example, door 128 is attached to box 102 of test chamber 100 using hinge 300.

Figure 4:
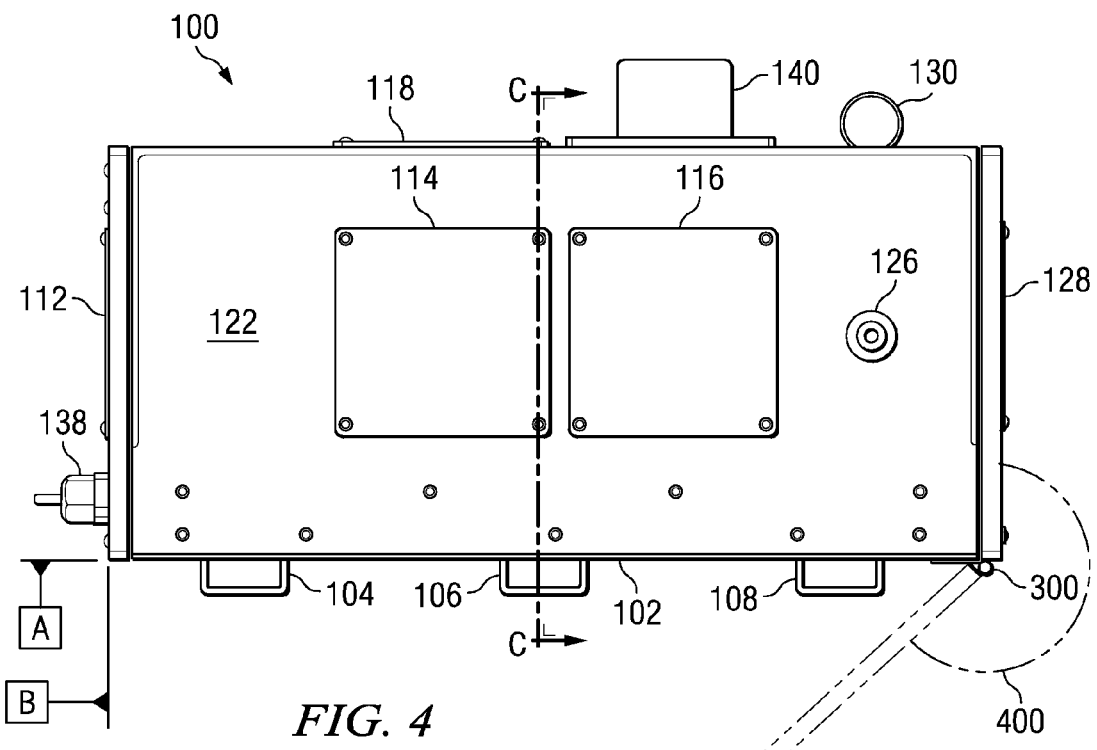
FIG. 4 is a side view of a test chamber in accordance with an advantageous embodiment of the present invention.

Turning now to FIG. 4, a side view of a test chamber is depicted in accordance with an advantageous embodiment of the present invention. In this example, door 128 may move along line 400 to allow for a tray to be placed into and removed from the interior of box 102.

Figure 5:
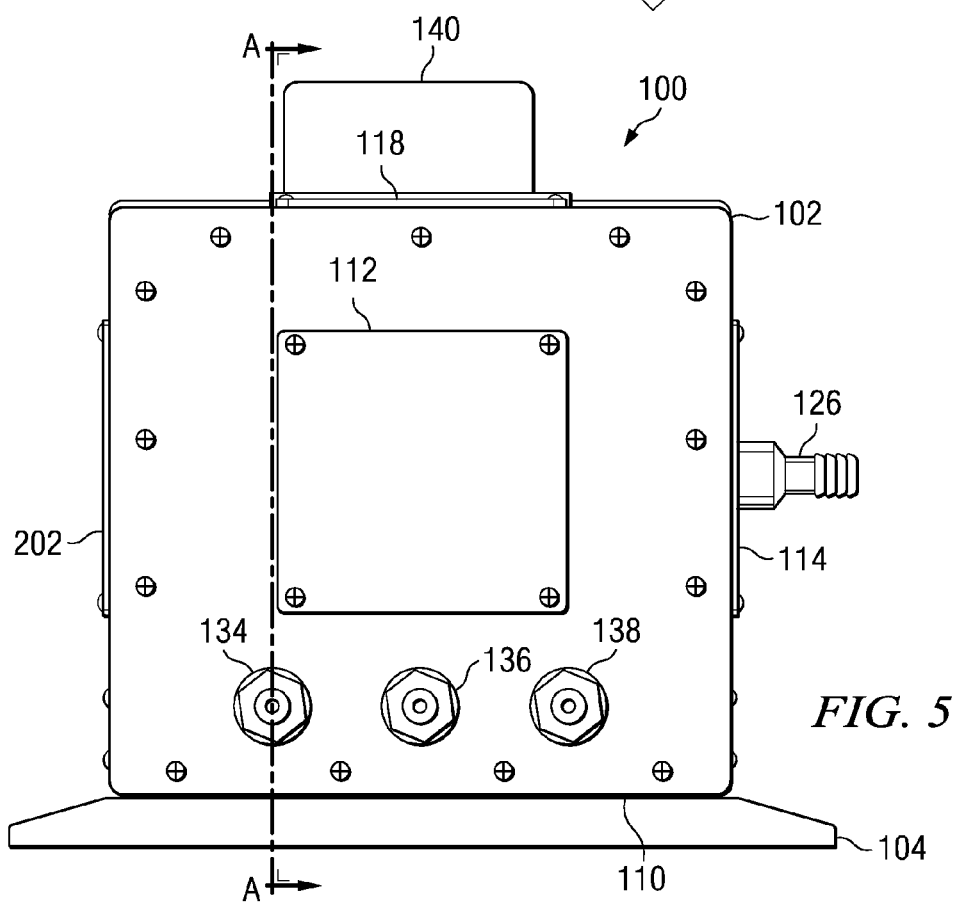
FIG. 5 is a rear view of a test chamber in accordance with an advantageous embodiment of the present invention.
Figure 6:
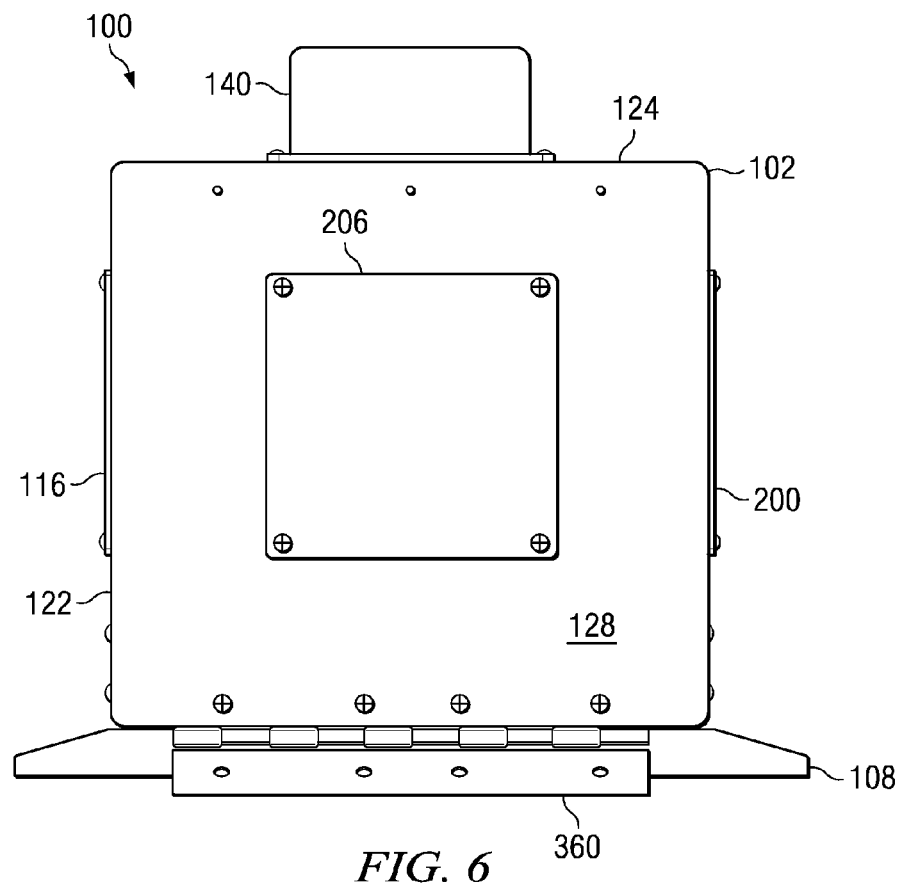
FIG. 6 provides a front view of a test chamber in accordance with an advantageous embodiment of the present invention.

Turning now to FIG. 5, a rear view of test chamber 100 is depicted in accordance with an advantageous embodiment of the present invention. Next, FIG. 6 provides a front view of test chamber 100 in accordance with an advantageous embodiment of the present invention.

With reference now to FIGS. 7-13, different views and cross sections of a tray are depicted in accordance with an advantageous embodiment of the present invention. In these examples, the tray provides another advantage by allowing different specimens to be tested without having to take time to mount or connect and dismount or disconnect each specimen for a test. This type of feature is provided in these examples through using multiple trays. Specimens may be attached or mounted on the different trays prior to testing or while testing occurs.

As a result, while a specimen is being tested in test chamber 100, another specimen may be mounted on another tray while the testing occurs. As a result, time is saved by not having to wait for testing to finish before mounting another specimen. When one specimen has been tested, the tray with that specimen may be removed from test chamber 100 and another tray with another specimen may be promptly inserted.

Figure 7:
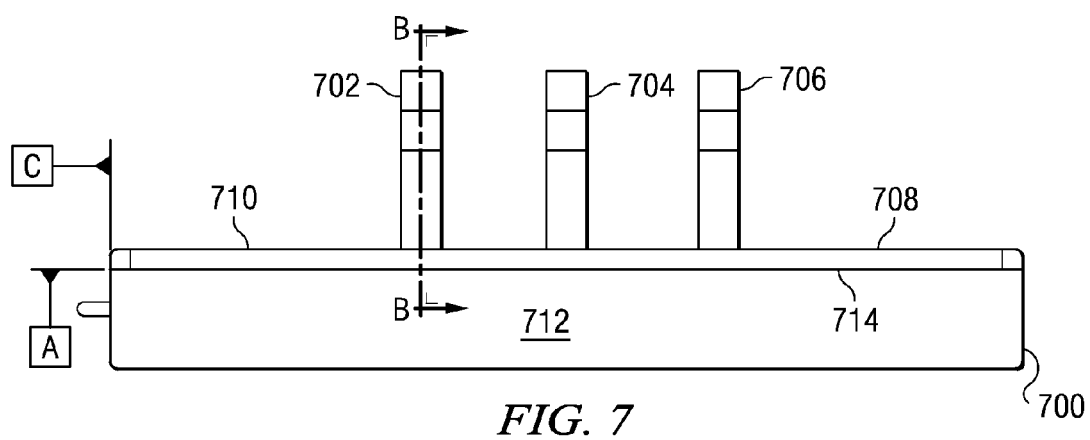
FIG. 7 is a side view of a tray and the specimen clamping system in accordance with an advantageous embodiment of the present invention.

With reference first to FIG. 7, a side view of a tray is depicted in accordance with an advantageous embodiment of the present invention. Tray 700 is an example of a tray that may be placed into box 102 of test chamber 100. In this view of tray 700, specimen clamps 702, 704, and 706 extend from surface 710 of planar section 708 of tray 700. These specimen clamps are used to physically mount specimens. Further, these specimen clamps provide electrical connections to connect the specimen mounted with a power electrical source. The mounting posts help center the test specimen in the test chamber interior.

In these illustrative examples, planar section 708 is made of an insulator material, such as, for example, polycarbonate. Of course, any insulating material may be used depending on the particular examples. Planar section 708 has a configuration that is designed to slide into the interior of box 102. In this example, tray 700 also includes beam 712. Beam 712 is a planar section that is mounted perpendicular to surface 714 of tray 700.

Tray 700 is an example of a platform that may be used to mount and test specimens. The illustration of tray 700 is only meant to illustrate one embodiment. For example, other embodiments may use other numbers of specimen clamps or other mechanisms to hold specimens other than using clamps.

Figure 8:
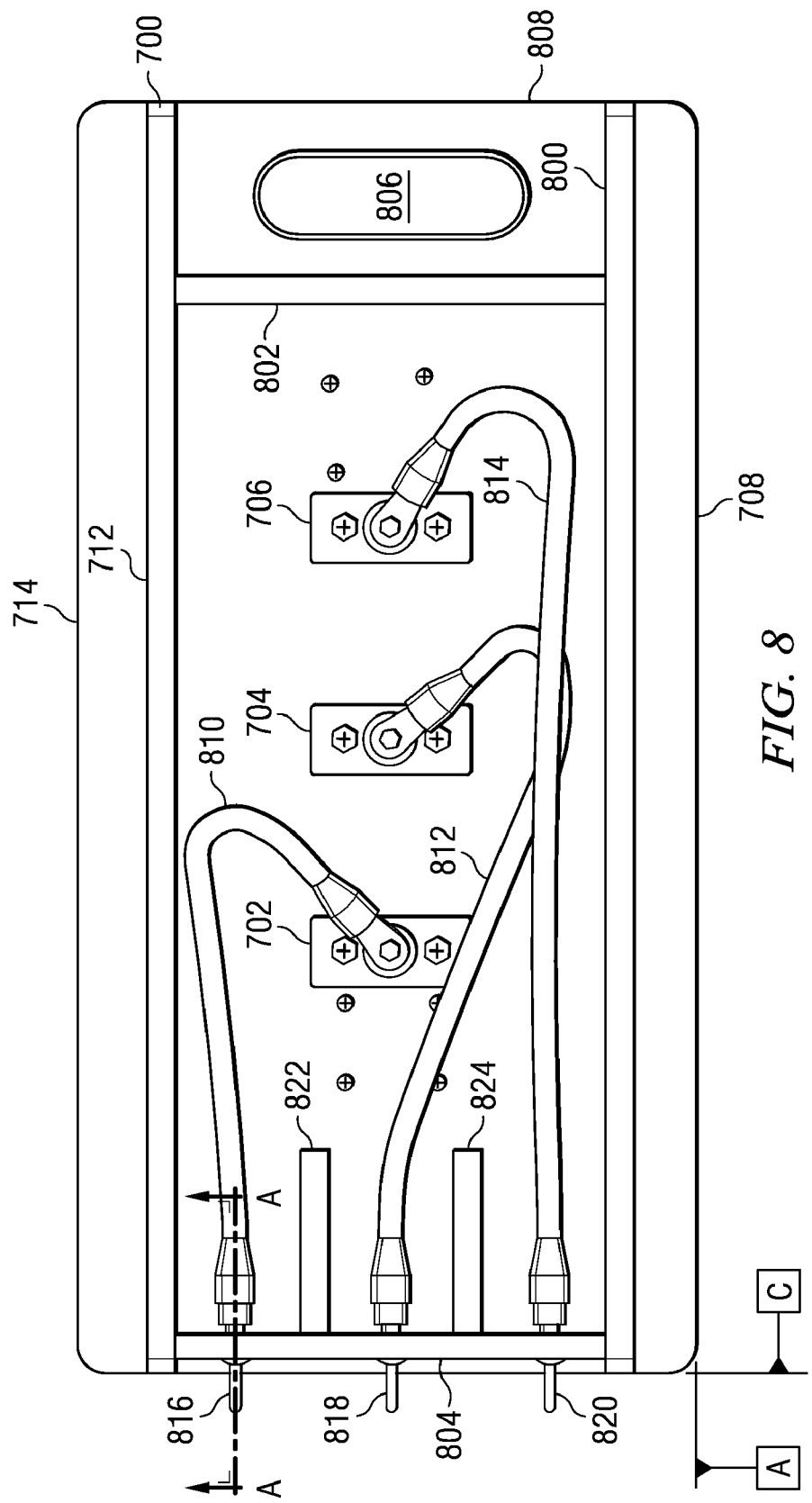
FIG. 8 is a bottom view of a tray in accordance with an advantageous embodiment of the present invention.

Turning next to FIG. 8, a bottom view of tray 700 is depicted in accordance with an advantageous embodiment of the present invention. As can be seen, in addition to beam 712 extending perpendicular from surface 714 of tray 700, beams 800, 802, and 804 also are present. These beams also extend in a direction perpendicular from surface 714 of tray 700.

Additionally, in this view, tray 700 includes hole 806, which is oval in shape. Hole 806 in tray 700 provides a handle or grip for a user to insert and remove tray 700 from box 102. In these examples, section 808 of tray 700 is covered with a rubber gasket to provide additional sealing between the top of box 102 in FIG. 1 and the volume below tray 700. The sealing prevents the flammable gaseous mixture from reaching the bottom of box 102 in amounts that can cause an ignition by the components under tray 700.

Beams 712, 800, 802, and 804 are configured to support tray 700 when outside test chamber 100 in FIG. 1, preventing electrical connections, fasteners and other hardware from contacting the supporting surface. In these examples, cables 810, 812, and 814 are used to provide an electrical connection between mounting posts 702, 704, and 706, and pins 816, 818, and 820, respectively.

When tray 700 is placed into box 102 in the test chamber, pins 816, 818, and 820 fit into sockets 134, 136, and 138. In this manner, an electrical connection may be quickly made to the specimen without having to connect and disconnect laboratory equipment. The connections to sockets 134, 136, and 138 do not have to be connected and disconnected each time a new specimen is tested. In this example, beams 822 and 824 also are present to provide for additional structural rigidity in these examples. Further, these beams also serve to separate cables 810, 812, and 814 in these examples. Cables 810, 812, and 814 may be any type of cable that has a conductive core of sufficient current carrying capacity for simulating a lightning strike and an insulated exterior capable of electrically insulating the voltage required by the test.

Figure 9:
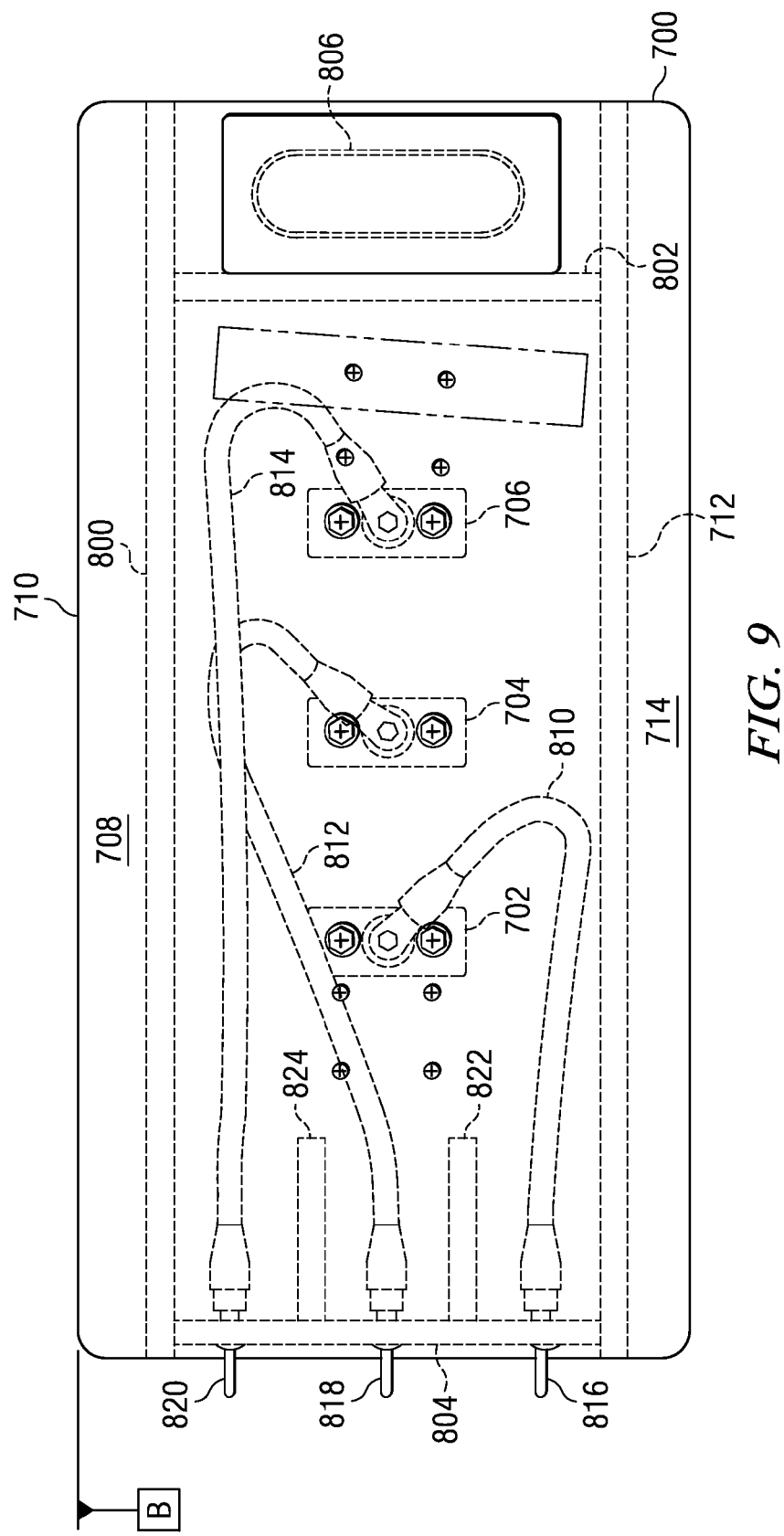
FIG. 9 is a top view of a tray in accordance with an advantageous embodiment of the present invention.

With reference to FIG. 9, a top view of tray 700 is depicted in accordance with an advantageous embodiment of the present invention.

Figure 10:
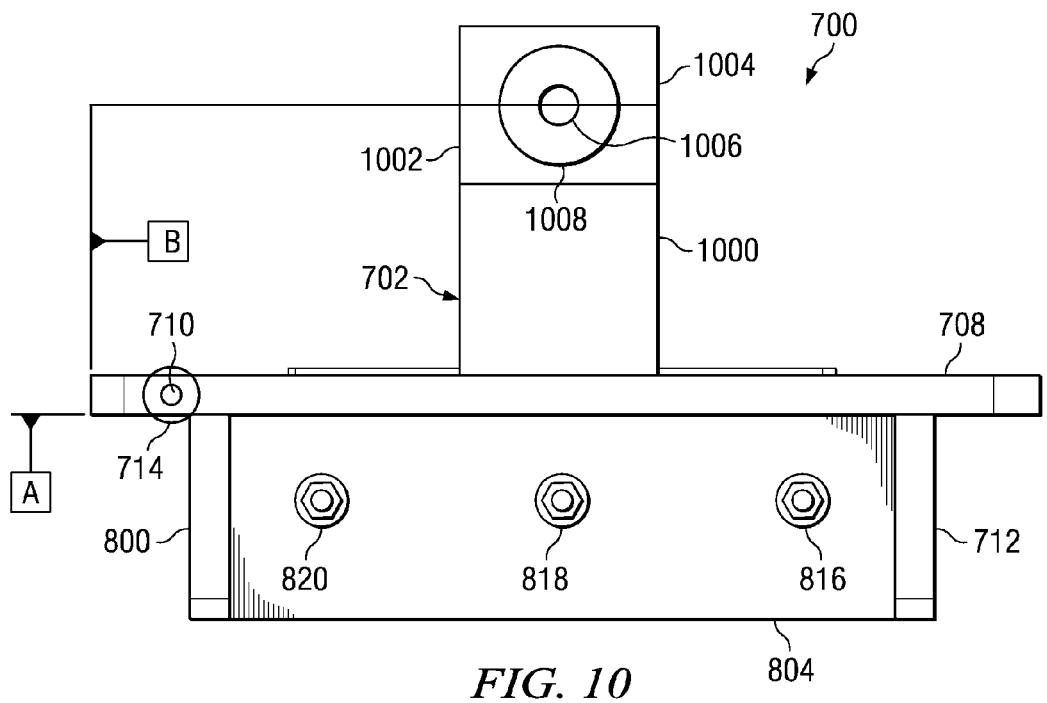
FIG. 10 is a view of an end of a tray and the specimen clamping system in accordance with an advantageous embodiment of the present invention.

Turning now to FIG. 10, a view of an end of tray 700 is depicted in accordance with an advantageous embodiment of the present invention. In this example, a more detailed illustration of mounting post 702 is shown.

In these examples, mounting post 702 includes riser 1000, cradle 1002, and cap 1004. Riser 1000 extends from surface 710 of planar section 708 in tray 700. Cradle 1002 is attached to riser 1000. Cap 1004 covers cradle 1002 to clamp a test specimen in place. In this illustrative example, opening 1006 is formed when cap 1004 is attached to cradle 1002. Further, insulator 1008 is present within the step or groove formed within cap 1004 and cradle 1002. A portion of a specimen may be secured between cradle 1002 and cap 1004. A test specimen, such as a tube or hose may be secured between these two components.

Figure 11:
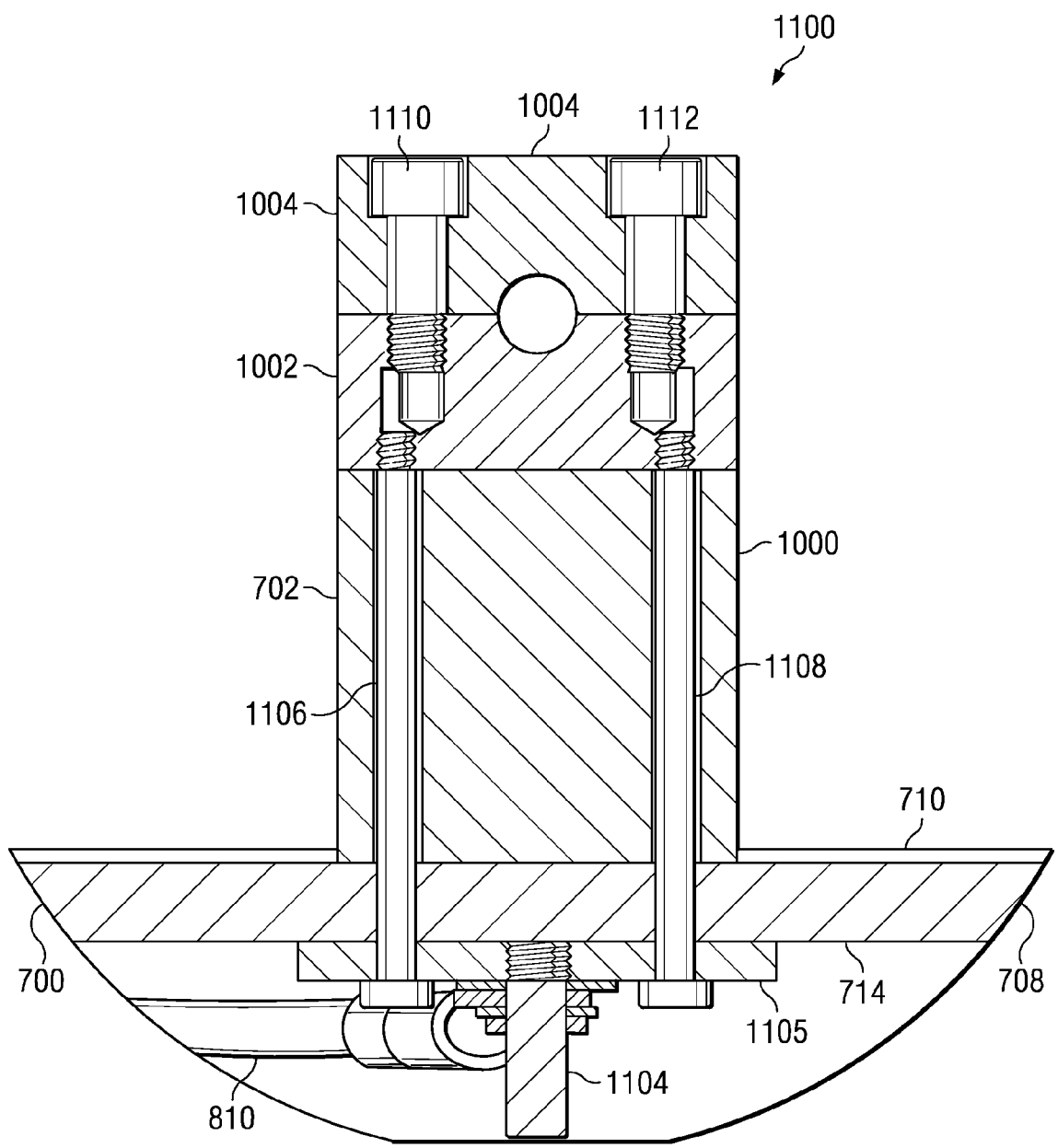
FIG. 11 is a more detailed illustration of the specimen clamping system in accordance with an advantageous embodiment of the present invention.

Turning now to FIG. 11, a more detailed illustration of a specimen clamp is depicted in accordance with an advantageous embodiment of the present invention. Section 1100 is a more detailed illustration of specimen clamp 702 in cross section along line B-B. In this example, cradle 1002 and cap 1004 are made of a conductive metal, such as aluminum. Of course, other types of conductive materials may be used. Copper, bronze, or steel are other examples of conductive materials that may be used.

Riser 1000 also is made of a conductive material in these examples. Alternatively, riser 1000 may be made from a non-conducting material. In this particular example, riser 1000 may be made of just about any material with sufficient strength, conductive or non-conductive. Terminal assembly 1105 is attached to surface 714 of planar section 708. Terminal assembly 1105 includes mounting post 1104 and plate 1102 both of which should be made from a highly conductive material such as copper. Mounting post 1104 may be made as part of terminal assembly 1102 or may be a separate component that is welded or brazed to terminal 1102. Mounting post 1104 provides a connector for cable 810, which is fastened to mounting post 1104 with a nut and washer (not shown). Planar section 708 is disposed between terminal assembly 1105 and riser 1000.

Electrical connection is made between terminal assembly 1105 and specimen cradle 1002 through connectors 1106 and 1108. In these examples, connectors 1106 and 1108 extend through terminal assembly 1105, through planar section 708, and through riser 1000 into cradle 1002. This connector serves to physically connect terminal assembly 1105, riser 1000, and cradle 1002 to each other.

Further, connectors 1106 and 1108 serve to provide a conductive path for current that may run between cable 810 and cradle 1002. In these examples, connectors 1106 and 1108 take the form of a copper rod that has been threaded on both ends and a nut brazed to one end. Of course, any highly conductive material may be used.

Connectors 1110 and 1112 are used to connect cap 1004 to cradle 1002. Cap 1004 and cradle 1002 must come in contact face to face to provide a current path and eliminate a possible site of arcing that may result in false positive test results. Connectors 1110 and 1112 are removable to allow cap 1004 to be removed from and then reattached to cradle 1002. A portion of a specimen may be placed between cap 1004 and cradle 1002. Then, connectors 1110 and 1112 may be tightened to hold the specimen in place. In this manner, a portion of the specimen is now rigidly fixed in place and connected in a manner that allows for electrical currents to be run through the specimen.

Figure 12:
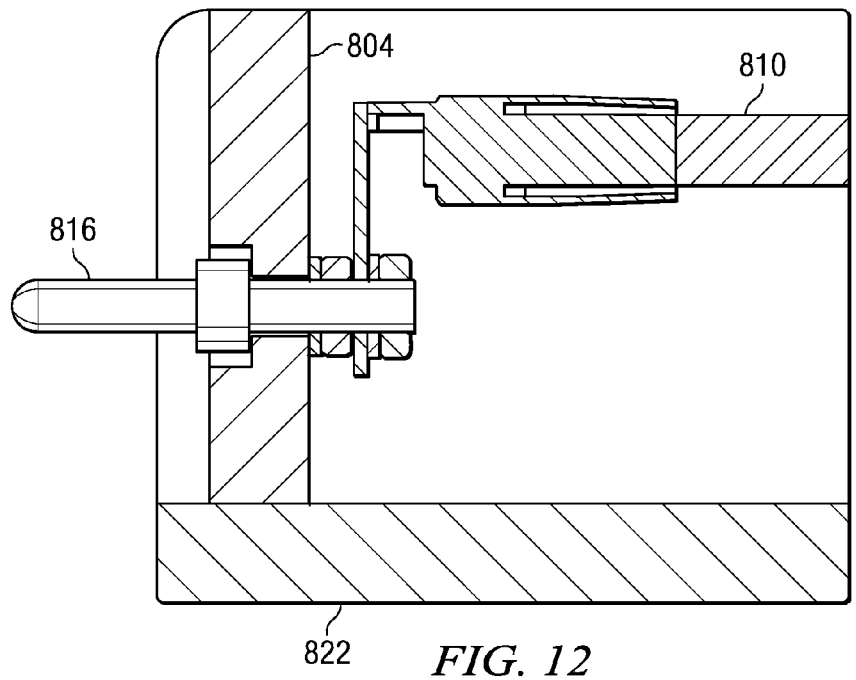
FIG. 12 is a diagram illustrating a connection of a cable to a pin in accordance with an advantageous embodiment of the present invention.

Turning now to FIG. 12, a diagram illustrating a connection of a cable to a socket pin is depicted in accordance with an advantageous embodiment of the present invention. The illustrated connection is a cross section along lines A-A in FIG. 8. In this example, pin 816 uses a highly conductive material and provides a connection to cable 810. Pin 816 connects with a socket, such as socket 138 when tray 700 is placed into box 102.

Figure 13:
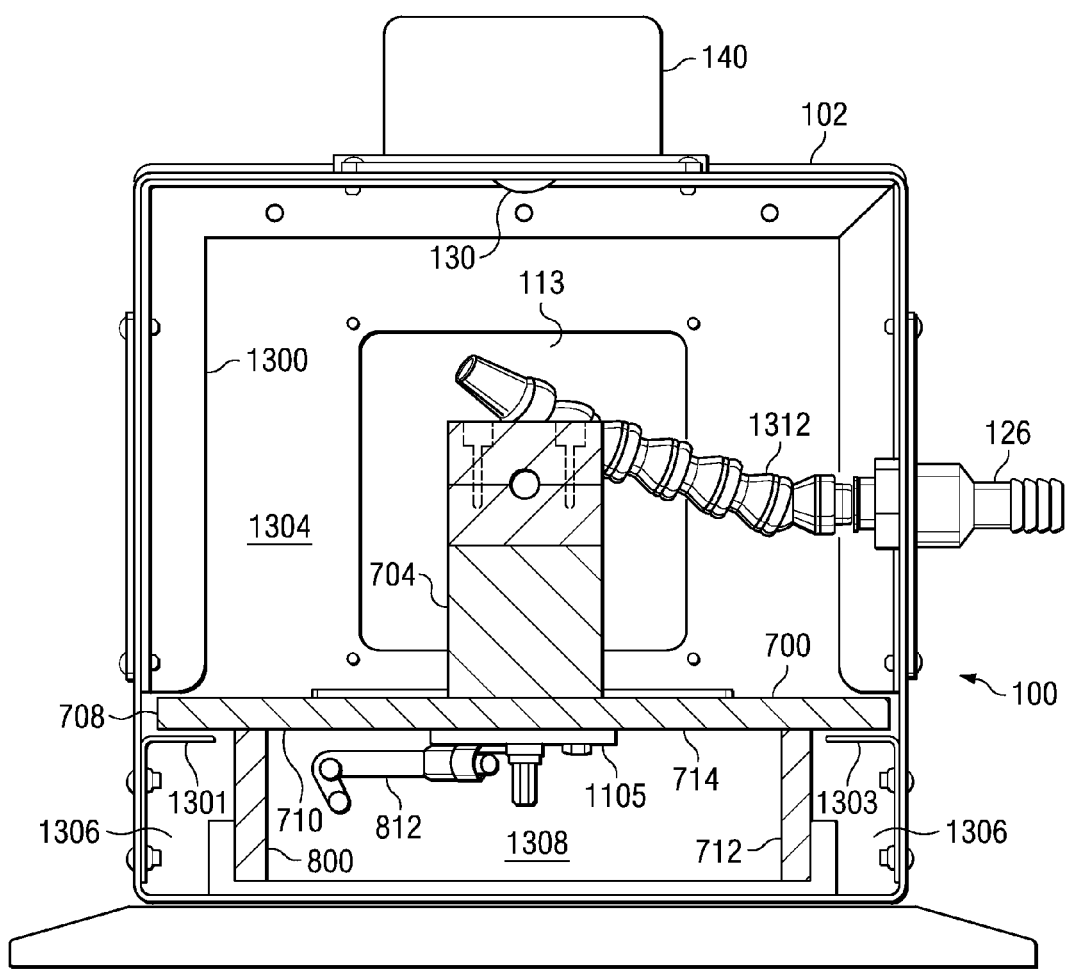
FIG. 13 is a cross sectional view of the complete hardware described in accordance with an advantageous embodiment of the present invention.

Turning now to FIG. 13, a cross sectional view of a test chamber is depicted in accordance with an advantageous embodiment of the present invention. In this particular example, the illustration in FIG. 13 is taken along lines C-C in FIG. 4. In this illustrative example, tray 700 has been placed into interior 1300 of box 102. As can be seen, planar section 708 of tray 700 serves to create section 1304 within interior 1300. Section 1304 is isolated from the electrical connections located on surface 714 by the planar section 708. Surface 714 rests on the flanges 1301 and 1303 of box 102. This configuration results in seals around the periphery of tray 700, and a flap covering the handle of tray 700. The flanges and flaps serve to reduce the amount of gas that may move from section 1304 into section 1306 and section 1308. In other words, the seal between sections 1308 and 1304 is made between tray 708, the flanges on bottom 110 of box 102 and the two seals, one on the front of the box and one on the door.

These different enclosed sections do not need to be air tight in these examples but must be resistant to air movement. The sections are designed to prevent gas from moving within section 1304 into section 1308 in an amount that could cause an ignition of the gases and false positive result. All connections in areas 1306 and 1308 are made to be non-arcing but sealing the gas from these areas is further insurance against false positive test results.

In this example, flexible conduit 1312 is attached to port 126. Flexible conduit 1312 provides a mechanism to introduce gas into section 1304 in interior 1300 of box 102 from a gas supply system. The flexible conduit is to be oriented such that the exiting gas is directed down the center of the test specimen ensuring the gas mixture is evenly distributed both inside and outside the test specimen.

Figure 14:
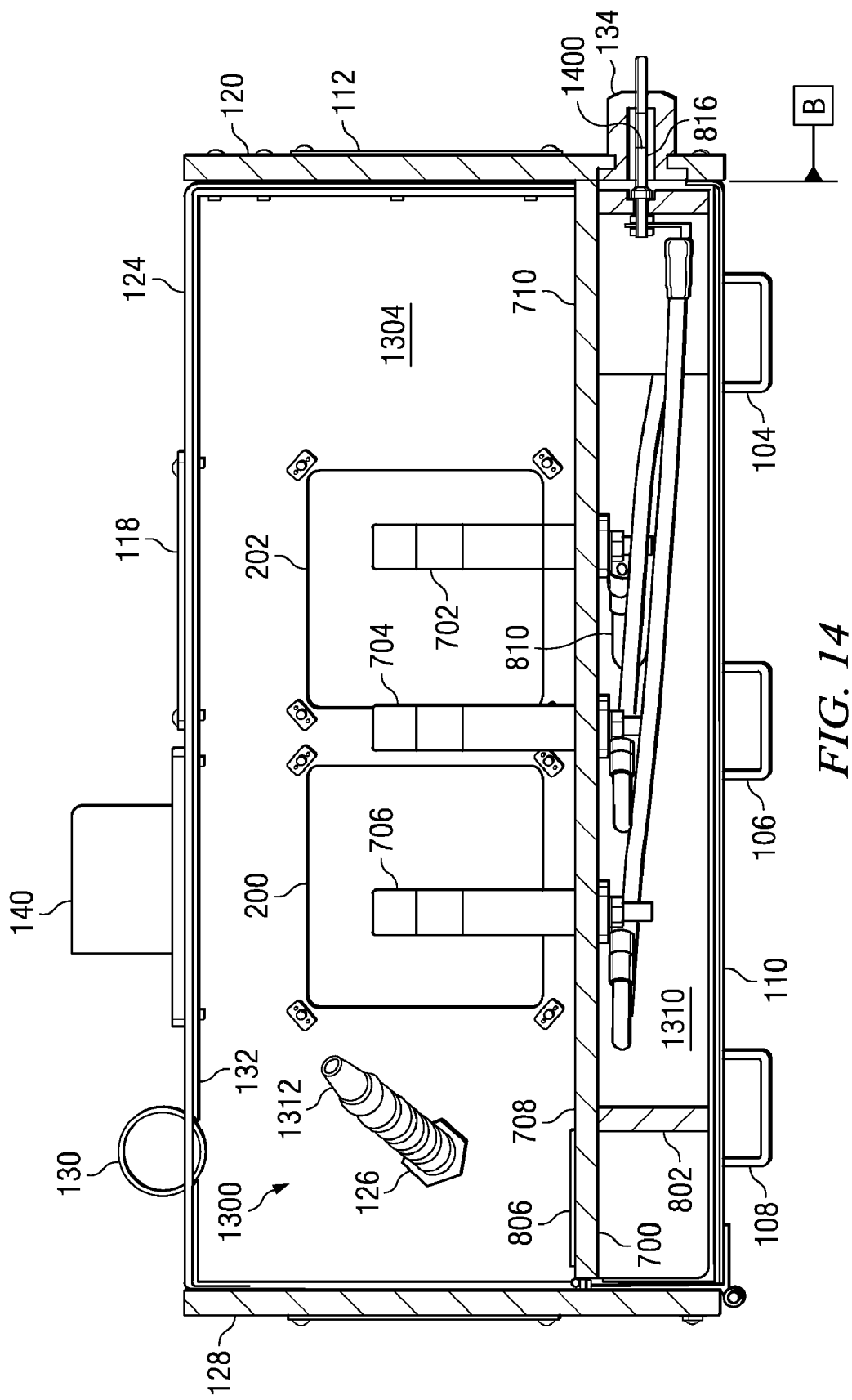
FIG. 14 is a cross sectional view of the complete hardware described in accordance with an advantageous embodiment of the present invention.

Turning next to FIG. 14, a cross sectional view of a test chamber is depicted in accordance with an advantageous embodiment of the present invention. In this particular example, the cross section is taken along lines AA in FIG. 5. In this illustrative example, the volume in section 1304 of interior 1300 is approximately 2550 cubic inches.

Further, in this illustration, the electrical connection between tray 700 and socket 134 is seen in more detail. Tip 1400 of pin 816 fits into socket 134 allowing pin 816 to form an electrical connection between these two parts. Socket 134 may be connected to a power supply to supply current to cable 810 through pin 816. This is duplicated at the other pin and socket pairs. In this manner, connections between laboratory equipment, such as a gas supply and a current source do not have to be connected and disconnected each time a test is run.

Figure 15:
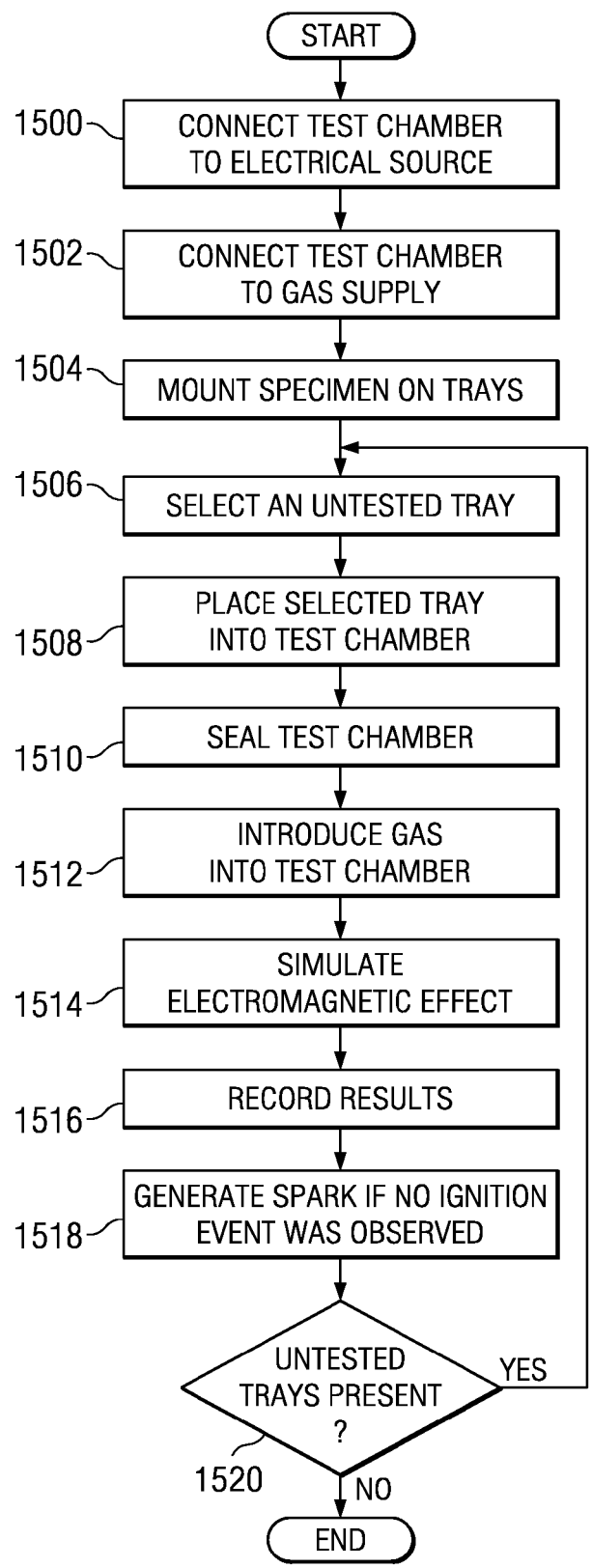
FIG. 15 is a flowchart of a process for testing specimens in accordance with an advantageous embodiment of the present invention.

With reference now to FIG. 15, a flowchart of a process for testing specimens is depicted in accordance with an advantageous embodiment of the present invention. The process illustrated in FIG. 15 may be implemented using the test chamber illustrated in FIGS. 1-14.

The process begins by connecting the test chamber to an electrical source (operation 1500). In these examples, the electrical source is connected to sockets 134, 136, and 138. Thereafter, the test chamber is connected to a gas supply (operation 1502). In these examples, the gas supply is connected to port 126 in FIG. 1.

Next, specimens are mounted using the specimen mounting clamps, 702, 704, and 706 to trays, such as tray 700 in FIG. 7. In these examples, the specimens may be, for example, connectors in the form of a joint, sleeve, or clamp that connects tubes, hoses, or other types of conduits to each other. The specimens also may be an assembly of connectors with conduits. For example, a sleeve may connect two hoses together. An example of specimens mounted on a tray is described in more detail below with reference to FIG. 16.

Thereafter, an untested tray is selected for testing (operation 1506). The selected tray is placed into the test chamber (operation 1508) thereby making an electrical connection between 816, 818, 820 and 134, 136, and 138 respectively. Next, the test chamber is sealed (operation 1510). The test chamber is sealed by closing the door to the test chamber in these examples.

A gas mixture is then introduced into the test chamber (operation 1512). Test specifications, may require a volumetric exchange of three to five times the chamber volume. The number of exchanges differs depending on test requirements. Because the chamber operates at atmospheric pressure, any gas entering the chamber must be matched by an equivalent volume of gas leaving the chamber. The exiting gas leaves the chamber through the reaction ball opening. When the gas supply is shut off, the reaction ball, acting as a check valve, seals this opening.

Afterwards, an electromagnetic effect is simulated in the test chamber (operation 1514). In these examples, the simulation is performed by applying the current to the sockets 134, 136, and 138. The electrical current travels through the sockets, pins, cables, terminal assembly connectors, specimen cradles, and through the specimens themselves, creating a circuit. Current may be routed to different components in different directions by applying current to the different external sockets 134, 136, 138. Thereafter, any results, i.e. ignition events, are recorded (operation 1516).

If no ignition event was noted, spark generator 140 is charged and fired (operation 1518). At this point an ignition should occur indicating there was a flammable gas mixture present.

Then, a determination is then made as to whether untested trays are present (operation 1520). If untested trays are not present, the process terminates. Otherwise, the process returns to operation 1506 to select another tray for testing. In this manner, multiple trays may be prepared with specimens for testing.

In this manner, after one specimen is tested, the tray for that specimen may be removed and another tray with a different specimen may be promptly placed into the test chamber for immediate testing. This is opposed to having to wait for the specimen to be removed and for a new specimen to be mounted in the test chamber itself. Further, while a specimen is being tested in the test chamber, another specimen may be placed on an empty tray such that the new specimen is ready for testing when testing has been completed on the current specimen.

The different blocks illustrated in FIG. 15 are presented in a particular order for purposes of providing one illustrative embodiment. Different operations may be performed in different orders depending on the particular implementation. For example, the electrical source may be connected to the test chamber after the gas supply is connected to the test chamber. Further, these specimens may be mounted before these other operations occur. In these examples, operations 1506-1514 are performed in a particular order for the test procedure being used in these examples.

Figure 16:
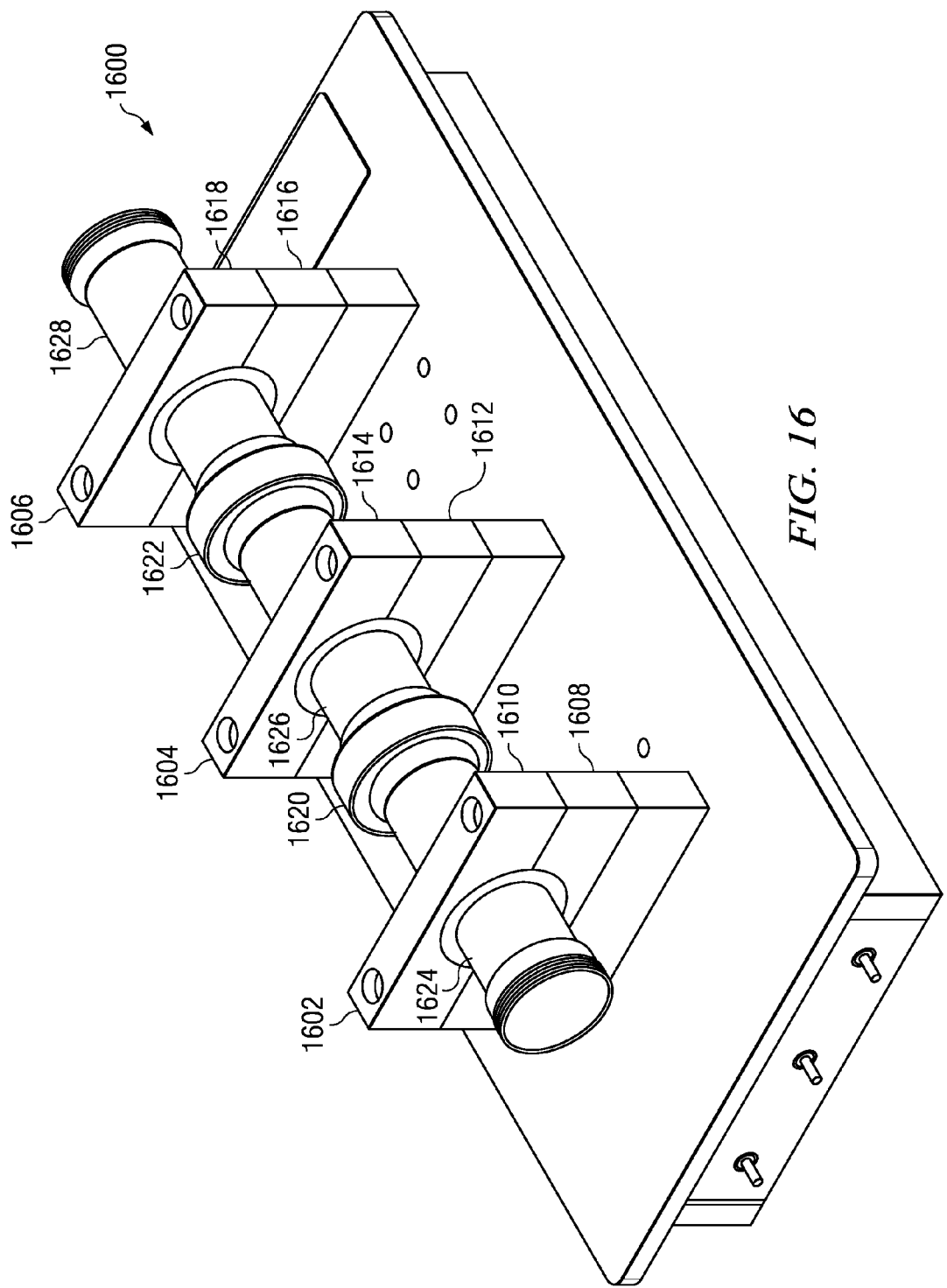
FIG. 16 is an isometric view of a tray and specimen support system with a representative specimen installed.

With reference now to FIG. 16, a diagram of an isometric view of two specimens mounted on a tray is depicted in accordance with an advantageous embodiment of the present invention. In this example, tray 1600 is an example of tray 700 in FIG. 7. Tray 1600 includes specimen clamps 1602, 1604, and 1606. Specimen clamp 1602 includes cradle 1608 and cap 1610. Specimen clamp 1604 includes cradle 1612 and cap 1614. In a similar fashion, specimen clamp 1606 includes cradle 1616 and cap 1618.

In these examples, specimens 1620 and 1622 are couplings used to connect tubes 1624, 1626, and 1628. In this example, specimen 1620 connects tubes 1624 and 1626, while specimen 1622 connects tubes 1626 and 1628. Tube 1624 is placed onto cradle 1608; tube 1626 is placed onto cradle 1612; and tube 1628 is placed onto cradle 1616.

After the tubes have been placed onto cradles 1608, 1612, and 1616. After specimen 1620 has been placed onto these cradles, caps 1610, 1614, and 1618 are secured to cradles 1608, 1612, and 1616 to secure specimen 1620 in place for testing. As discussed above, specimen clamps 1602, 1604, and 1606 conduct currents to simulate an electromagnetic event, such as a lightning strike.

One of specimen clamps 1602, 1604, and 1606 acts as a current source while another one of these clamps acts as a ground. The remaining specimen clamps may be configured to function as a source or ground depending on the implementation. For example, specimen clamp 1604 may act as a ground while specimen clamps 1602 and 1606 are current sources. In another example, specimen clamp 1604 may function as a current source with specimen clamps 1602 and 1606, functioning as ground. Other configurations are possible by changing the connections to the test chamber.

Also, the shape or configuration of specimen clamp 1602, 1604, and 1606 may differ depending on the type of specimens that are to be tested. Further, depending on the implementation, a different cap and cradle setup may be mounted onto tray 1600 depending on the test to be performed.

The description of the present invention has been presented for purposes of illustration and description, and is not intended to be exhaustive or limited to the invention in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the invention, the practical application, and to enable others of ordinary skill in the art to understand the invention for various embodiments with various modifications as are suited to the particular use contemplated.

What is claimed is:

1. An apparatus for testing electromagnetic effects, the apparatus comprising:
    a chamber having an opening into an interior space located in the chamber;
    a door connected to the chamber, wherein closing the door seals the opening and prevents a flammable gaseous mixture in the interior space from leaking out of the interior space of the chamber;
    a gas supply system attached to the chamber, wherein the gas supply system is configured for connection to the chamber to allow introduction of the flammable gaseous mixture into the interior space;
    a plurality of electrical connectors attached to the chamber;
    a removable platform, wherein the removable platform is moveable into and out of the interior space of the chamber through the opening; and
    a specimen holding system located on the removable platform, wherein the specimen holding system is configured to hold a specimen and is electrically connected to the plurality of electrical connectors when the removable platform is placed into the chamber, wherein an electrical current travels through the specimen when the electrical current is supplied by an electrical current source that is connected to the plurality of electrical connectors.

2. The apparatus of claim 1, wherein the removable platform has a top side and a bottom side and wherein the specimen holding system comprises:
    a plurality of posts extending from the top side of the removable platform, wherein each post in the plurality of posts has a cradle and a cap in which the cradle adapted to receive a portion of the specimen and the cap holds the portion of the specimen in place when the cap is attached to the cradle.

3. The apparatus of claim 2, wherein the plurality of posts are electrically connected to the plurality of electrical connectors through a plurality of cables and a plurality of pins located on the bottom side of the removable platform, wherein each cable in the plurality of cables has one end electrically connected to a post in the plurality of posts and another end connected to a pin in the plurality of pins, and wherein the plurality of pins electrically connect to a plurality of electrical sockets when the removable platform is placed into the chamber such that the plurality of pins touch the plurality of electrical sockets.

4. The apparatus of claim 2, wherein the plurality of posts are formed from a conductive material.

5. The apparatus of claim 4, wherein the conductive material is selected from one of aluminum, steel, brass, and copper.

6. The apparatus of claim 1, wherein the gas supply system comprises:
a port located on a wall of the chamber; and
a flexible member located in the interior space and connected to the port, wherein the flexible member has a channel that allows the flammable gaseous mixture to flow from the gas supply system to the interior space of the chamber and wherein the flexible member allows gas flow to be directed through the test specimen to ensure even distribution both inside and outside the specimen.

7. The apparatus of claim 1 further comprising:
a plurality of windows formed in the chamber.

8. The apparatus of claim 1, wherein the chamber has a top side and further comprising:
an exhaust port formed in the top side of the chamber; and
a reaction ball, wherein the reaction ball lies over the exhaust port to prevent the flammable gaseous mixture from escaping the chamber when the flammable gaseous mixture has a pressure that does not move the reaction ball off the exhaust port and wherein the reaction ball provides a visual signal of an ignition event.

9. The apparatus of claim 1, wherein the door has a magnetic latching mechanism that keeps the door in a closed position and prevents an over pressure condition from occurring.

10. The apparatus of claim 1 further comprising:
an ignition unit, wherein the ignition unit is used to generate a spark in the interior space of the chamber.

11. The apparatus of claim 1, wherein the removable platform is non-conductive.

12. The apparatus of claim 11, wherein the removable platform is made from polycarbonate.

13. An apparatus comprising:
a chamber;
an electrical interface in the chamber;
a platform, wherein the platform is moveable into and out of the chamber;
a port, wherein the port allows introduction of a flammable gas mixture into an interior of the chamber; and
a specimen mounting apparatus located on the platform, wherein the specimen mounting apparatus provides an electrical connection between the electrical interface and a specimen mounted on the specimen mounting apparatus, wherein an electrical current applied to the electrical interface travels from the electrical interface to the specimen mounting apparatus and through the specimen.

14. The apparatus of claim 13, wherein the specimen mounting apparatus comprises:
a plurality of posts, wherein each post in the plurality of posts is configured to hold a portion of the specimen, wherein the electrical current travels from one post in the plurality of posts through the specimen to another post in the plurality of posts when current is applied to the electrical interface.

15. The apparatus of claim 13, wherein the platform is formed from an insulating material.

16. The apparatus of claim 13, wherein the platform is a first platform and the specimen mounting apparatus is a first specimen mounting apparatus and further comprising:
a second platform, wherein the second platform is moveable into and out of the chamber; and
a second specimen mounting apparatus located on the second platform.

17. The apparatus of claim 13 further comprising:
an exhaust port formed in a top side of the chamber; and
a reaction ball, wherein the reaction ball lies over the exhaust port to prevent the flammable gaseous mixture from escaping the chamber when the flammable gaseous mixture has a pressure that does not move the reaction ball off the exhaust port.

18. A method for testing specimens, the method comprising:
connecting a current source to an electrical interface in a test chamber;
connecting a gas supply to a port in the test chamber;
mounting a specimen on a platform;
placing the platform with the specimen into the test chamber;
sealing the test chamber after placing the platform into the test chamber;
introducing a flammable gaseous mixture into an interior of the test chamber after sealing the test chamber; and
supplying current from the current source to the electrical interface to simulate an electromagnetic effect on the specimen.

19. The method of claim 18, wherein the specimen is a first specimen and the platform is a first platform and further comprising:
removing the first platform with the first specimen from the test chamber;
placing a second platform with a second specimen mounted on the platform into the test chamber;
sealing the test chamber with the second platform inside the test chamber;
introducing the flammable gaseous mixture into the test chamber with the second platform after sealing the test chamber; and
supplying an electrical current from the current source to the electrical interface to simulate the electromagnetic effect on the second specimen.

20. The method of claim 18, wherein the specimen is a first specimen and the platform is a first platform and further comprising:
mounting a second specimen on a second platform while the first specimen is being tested.

* * * * *